US 6,566,945 B2

(12) United States Patent
Nakayama et al.

(10) Patent No.: US 6,566,945 B2
(45) Date of Patent: May 20, 2003

(54) FEEDFORWARD AMPLIFIER

(75) Inventors: Masatoshi Nakayama, Tokyo (JP); Kenichi Horiguchi, Tokyo (JP); Yuji Sakai, Tokyo (JP); Yukio Ikeda, Tokyo (JP); Kazuyuki Totani, Tokyo (JP); Satoshi Kunugi, Tokyo (JP); Haruyasu Senda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/030,102

(22) PCT Filed: Apr. 3, 2001

(86) PCT No.: PCT/JP01/02900

§ 371 (c)(1),
(2), (4) Date: Jan. 17, 2002

(87) PCT Pub. No.: WO01/91283

PCT Pub. Date: Nov. 29, 2001

(65) Prior Publication Data

US 2002/0105379 A1 Aug. 8, 2002

(30) Foreign Application Priority Data

May 25, 2000 (JP) ........................................ 2000-154581

(51) Int. Cl.[7] ................................................ H03F 3/66
(52) U.S. Cl. ......................... 330/52; 330/149; 330/151
(58) Field of Search ........................... 330/52, 149, 151

(56) References Cited

U.S. PATENT DOCUMENTS

| 5,166,634 A | * | 11/1992 | Narahashi et al. | 330/151 |
|---|---|---|---|---|
| 5,304,945 A | * | 4/1994 | Myer | 330/149 |
| 5,565,814 A | * | 10/1996 | Fukuchi | 330/52 |
| 5,691,668 A | * | 11/1997 | Yoshikawa et al. | 330/151 |
| 5,789,976 A | * | 8/1998 | Ghannouchi et al. | 330/149 |
| 5,815,036 A | * | 9/1998 | Yoshikawa et al. | 330/151 |
| 5,847,603 A | * | 12/1998 | Myer | 330/52 |
| 5,977,826 A | * | 11/1999 | Behan et al. | 330/151 |
| 6,052,023 A | * | 4/2000 | Myer | 330/2 |
| 6,094,096 A | * | 7/2000 | Myer | 330/151 |
| 6,326,840 B1 | * | 12/2001 | Funada et al. | 330/52 |
| 6,400,223 B1 | * | 6/2002 | McLaren | 330/151 |

FOREIGN PATENT DOCUMENTS

| JP | 4-070203 | 3/1992 |
|---|---|---|
| JP | 4-083407 | 3/1992 |
| JP | 7-077330 | 8/1995 |

* cited by examiner

Primary Examiner—Michael Tokar
Assistant Examiner—Khai Nguyen
(74) Attorney, Agent, or Firm—Oblon, Spivak, McClelland, Maier & Neustadt, P.C.

(57) ABSTRACT

A feedforward amplifier combines an input signal combined by a first error rejection loop with an error component and a first pilot signal detected by a second error detection loop, thereby canceling out the error component and the first pilot signal residual in the input signal.

19 Claims, 9 Drawing Sheets ized by the divider 15, the auxiliary amplifier 17 amplifies the error component output from the vector regulator 16, and supplies it to the combiner 18.

FEEDFORWARD AMPLIFIER

TECHNICAL FIELD

The present invention relates to a feedforward amplifier for amplifying a radio frequency signal and the like with suppressing signal error.

BACKGROUND ART

A feedforward amplifier that implements low error characteristic by feedforward error compensation is often used in radio frequencies such as VHF, UHF and microwave bands as an amplifier that can achieve low error amplification.

The feedforward error compensation scheme can achieve good error compensation principally, and has an advantage of being able to configure an amplifier with very low error. However, it has a problem of deteriorating its error characteristics because of reduction in the error compensation amount of a feedforward system caused by variations in the amplifier characteristics due to ambient temperature or secular changes.

To solve the problem, a system is proposed that introduces a pilot signal into a loop constituting the feedforward error compensation system, and controls the amplifier and loop of the feedforward system by detecting the pilot signal.

FIG. 1 is a block diagram showing a configuration of a conventional feedforward amplifier disclosed in Japanese patent application laid-open No. 4-70203, for example. In this figure, the reference numeral 1 designates an input terminal of the feedforward amplifier; 2 designates a pilot signal oscillator for generating a first pilot signal (frequency f1); 3 designates a combiner for combining an input signal supplied from the input terminal 1 with the first pilot signal; 4 designates a feedforward system; 5 designates a pilot signal oscillator for generating a second pilot signal (frequency f2); 6 designates an error detection loop for amplifying the input signal supplied from the combiner 3, and for extracting an error component involved in the amplification of the input signal; and 7 designates an error rejection loop for canceling out the error component included in the input signal.

The reference numeral 8 designates a divider for dividing the input signal plus the first pilot signal combined by the combiner 3 into two paths; 9 designates a vector regulator for electrically regulating passing amplitude and phase of the input signal distributed by the divider 8; 10 designates a combiner for combining the input signal supplied from the vector regulator 9 with the second pilot signal; 11 designates a main amplifier for amplifying the input signal passing through the combining by the combiner 10; 12 designates a delay circuit for delaying the input signal distributed by the divider 8; and 13 designates a dividing combiner for dividing the input signal output from the main amplifier 11 into two portions, for supplying a first portion of the input signal to a delay circuit 14, and for extracting the error component produced by the main amplifier 11 by canceling out the input signal component of a second portion of the input signal by combining the second portion of the input signal with the input signal delayed by the delay circuit 12.

The reference numeral 14 designates the delay circuit for delaying the input signal supplied from the dividing combiner 13; 15 designates a divider for distributing the error component extracted by the dividing combiner 13 to two paths; 16 designates a vector regulator for electrically regulating the passing amplitude and phase of the error component distributed by the divider 15; 17 designates an auxiliary amplifier for amplifying the error component output from the vector regulator 16; and 18 designates a combiner for combining the input signal delayed by the delay circuit 14 with the error component after the amplification, thereby canceling out the error component included in the input signal.

The reference numeral 19 designates a pilot signal detector for detecting the first pilot signal from the output signal of the divider 15; 20 designates a control circuit for controlling the vector regulator 9 such that the power level (signal level) of the first pilot signal detected by the pilot signal detector 19 becomes minimum; 21 designates a divider for distributing the input signal, the error component of which is canceled out by the combiner 18, to two paths; 22 designates a pilot signal detector for detecting the second pilot signal from the input signal distributed by the divider 21; 23 designates a control circuit for controlling the vector regulator 16 such that the power level (signal level) of the second pilot signal detected by the pilot signal detector 22 becomes minimum; 24 designates a bandpass filter (abbreviated to BPF from now on) for eliminating the first pilot signal from the input signal distributed by the divider 21; and 25 designates an output terminal of the feedforward amplifier.

Next, the operation will be described.

First, when the combiner 3 combines the input signal supplied from the input terminal 1 with the first pilot signal, the error detection loop 6 amplifies the input signal, and detects the error component involved in the amplification of the input signal.

Specifically, the divider 8 of the error detection loop 6 divides the input signal supplied from the combiner 3 to two paths. Then, the vector regulator 9 electrically regulates the passing amplitude and phase of a first portion of the input signal. After that, the combiner 10 combines the input signal with the second pilot signal, and the main amplifier 11 amplifies the input signal passing through the combining by the combiner 10.

On the other hand, the delay circuit 12 delays a second portion of the input signal divided by the divider 8 by a predetermined time period, and supplies it to the dividing combiner 13.

The dividing combiner 13, receiving the input signal amplified by the main amplifier 11, divides the input signal into two portions, and supplies the first portion of the input signal to the delay circuit 14. On the other hand, it combines the second portion of the input signal with the input signal supplied from the delay circuit 12. Thus, it extracts the error component the main amplifier 11 generates by canceling out the input signal component in the input signal after amplification.

Here, the error detection loop 6 performs optimization as follows.

Specifically, when the pilot signal detector 19 detects the first pilot signal from the output signal of the divider 15, the control circuit 20 controls the vector regulator 9 such that the power level of the first pilot signal becomes minimum, thereby optimizing the error detection loop 6.

The error rejection loop 7 cancels out the error component in the input signal when the error detection loop 6 extracts the error component from the input signal.

Specifically, when the vector regulator 16 of the error rejection loop 7 electrically regulates the passing amplitude and phase of the error component distributed by divider 15, and then the auxiliary amplifier 17 amplifies the error component, the combiner 18 combines the amplified error component with the input signal delayed through the delay circuit 14, thereby canceling out the error component in the input signal. Thus, the error component in the input signal is canceled out by combining the input signal with the error component with the identical amplitude and opposite phase to those of the error component in the amplified input signal.

The error rejection loop 7 performs optimization as follows.

Specifically, when the pilot signal detector 22 detects the second pilot signal in the output signal of the divider 21, the control circuit 23 controls the vector regulator 16 such that the power level of the second pilot signal becomes minimum, thereby optimizing the error rejection loop 7.

The BPF 24 rejects the first pilot signal included in one of the two portions output from the divider 21 that divides the combined input signal fed from the combiner 18 into two paths, and supplies the output terminal 25 only with the input signal component of the input signal.

As is clear from the foregoing description, optimizing the error detection loop 6 and the error rejection loop 7 constituting the feedforward error compensation system can implement the optimum error compensation regardless of the ambient temperature change or secular change.

However, the conventional example (referred to as conventional example 1 from now on) has the following problems.

Specifically, according to the conventional example 1, although the second pilot signal used for optimizing the error rejection loop 7 can be canceled out principally by the error rejection loop 7 because it is monitored at the output side of the feedforward system 4, the first pilot signal used for optimizing the error detection loop 6 cannot be canceled out principally because it is not monitored at the output side of the feedforward system 4 (it is monitored at the divider 15). For this reason, the BPF 24 is used for canceling out the first pilot signal.

The BPF 24, however, has a large size and high loss in general, thereby presenting a problem of hindering the feedforward amplifier from being miniaturized and made highly efficient. More specifically, to achieve precise control of the feedforward amplifier, the frequency of the pilot signal must be made as close as possible to the frequency of the input signal to be amplified.

The close frequencies, however, present a problem of increasing the size and loss of the BPF 24 because the BPF 24 must have such a characteristic as passing the amplified input signal and rejecting the pilot signal.

To solve the foregoing problem, a scheme of eliminating the first pilot signal used for optimizing the error detection loop 6 (it is called conventional example 2 from now on). The technique is disclosed in Japanese patent application laid-open No. 4-83407, for example. FIG. 2 is a block diagram showing a configuration of a conventional feedforward amplifier disclosed in Japanese patent application laid-open No. 4-83407. In this figure, the same reference numerals designate the same or like portions to those of FIG. 1, and hence the description thereof is omitted here.

The reference numeral 26 designates a vector regulator for electrically regulating the passing amplitude and phase of the first pilot signal; 27 designates a pilot signal amplifier for amplifying the first pilot signal; 28 designates a combiner for combining the first pilot signal with the input signal divided by the divider 21, thereby canceling out the first pilot signal in the input signal; 29 designates a divider for dividing the combined input signal supplied from the combiner 28; 30 designates a pilot signal detector for detecting the first pilot signal; and 31 designates a control circuit for controlling the vector regulator 26 such that the power level (signal level) of the first pilot signal detected by the pilot signal detector 30 becomes minimum.

According to the conventional example 2, when the divider 21 divides the input signal and outputs its part, and then the pilot signal amplifier 27 amplifies the first pilot signal as in the conventional example 1, the combiner 28 combines the first pilot signal with the input signal divided by the divider 21, thereby canceling out the first pilot signal in the input signal. Specifically, the first pilot signal contained in the input signal is canceled out by the first pilot signal with the identical amplitude and opposite phase to those of the first pilot signal in the input signal.

In this case, to increase the rejection accuracy of the first pilot signal, when the pilot signal detector 30 detects the first pilot signal from the output signal of the divider 29, the control circuit 31 controls the vector regulator 26 such that the power level of the first pilot signal becomes minimum.

The conventional example 2, however, comprises the pilot signal amplifier 27 for canceling out the first pilot signal. The pilot signal amplifier 27 brings about a rather large power consumption, and is used only for canceling out the pilot signal, thereby not contributing to the error compensation of the feedforward amplifier. Thus, although the error performance of the entire feedforward amplifier is not improved, its efficiency is decreased and its size is increased. In addition, the combiner 28, which is installed at the output side of the feedforward amplifier, causes a loss, offering a problem of reducing the efficiency and increasing the size of the device.

To avoid the problems involved in using the pilot signal to optimize the error detection loop 6 in the conventional examples 1 and 2, a technique is proposed that controls the vector regulator by detecting the level of the input signal itself without using the pilot signal to optimize the error detection loop 6, which is disclosed in Japanese patent application publication No. 7-77330.

However, when the input signal is not supplied or very small, the control of the error detection loop 6 is impossible. Accordingly, when the input signal increases sharply (such as in a burst operation of a mobile communication), the loop control lags behind it, thereby presenting a problem of temporarily deteriorating the performance of the feedforward amplifier.

With the foregoing configurations, the conventional feedforward amplifiers have the following problems. The conventional example 1, which comprises the BPF 24 to prevent the first pilot signal from being output from the output terminal 25, has a problem in that since the BPF 24 has a large size and high loss in general, it not only increases the size of the feedforward amplifier, but also reduces the efficiency thereof.

The conventional example 2, which cancels out the first pilot signal using the pilot signal amplifier 27 and combiner 28 to obviate the BPF 24 from its component, has a problem in that since the pilot signal amplifier 27 and combiner 28 have some power consumption and loss, they increase the size of the feedforward amplifier and reduces the efficiency thereof without improving the error characteristic of the feedforward amplifier.

The method that optimizes the error detection loop by detecting the level of the input signal itself has a problem of deteriorating the error characteristic temporarily in the burst operation or the like because it cannot perform optimization control when the input signal is not supplied or very small.

The present invention is implemented to solve the foregoing problems. Therefore, an object of the present invention is to provide a small-size, highly efficient feedforward amplifier capable of compensating for the error characteristic.

DISCLOSURE OF THE INVENTION

According to a first aspect of the present invention, there is provided a feedforward amplifier that combines the input signal combined by first error rejection means with an error component and a first pilot signal detected by second error detection means, thereby canceling out the error component and the first pilot signal residual in the input signal.

It offers an advantage of being able to compensate for the error characteristic at high efficiency with a small device size.

The feedforward amplifier in accordance with the present invention may adjust the amplitude and phase of the error component and the first pilot signal detected by the second error detection means to minimize a signal level of the first pilot signal.

It offers an advantage of being able to minimize the output of the first pilot signal.

The feedforward amplifier in accordance with the present invention may adjust the amplitude and phase of the input signal combined with the first pilot signal by the combining means to minimize a signal level of the first pilot signal.

It offers an advantage of being able to improve the compensation accuracy of the error characteristic.

The feedforward amplifier in accordance with the present invention may combine a second pilot signal with the input signal, the first error rejection means adjusts amplitude and phase of the error component and the second pilot signal detected by the first error detection means to minimize a signal level of the second pilot signal.

It offers an advantage of being able to improve the compensation accuracy of the error characteristic.

The feedforward amplifier in accordance with the present invention may adjust the amplitude and phase of the error component detected by the first error detection means to minimize a signal level of the error component.

It offers an advantage of being able to improve the compensation accuracy of the error characteristic.

The feedforward amplifier in accordance with the present invention may adjust the amplitude and phase of the input signal supplied to the combining means to minimize a signal level of an input signal component contained in the input signal combined by the first error rejection means.

It offers an advantage of being able to improve the compensation accuracy of the error characteristic.

The feedforward amplifier in accordance with the present invention may adjust, when the first error detection means combines a second pilot signal with the input signal, the amplitude and phase of the error component and the first and second pilot signals detected by the second error detection means to minimize a signal level of the first and second pilot signals.

It offers an advantage of being able to achieve good error compensation over a wide range.

The feedforward amplifier in accordance with the present invention may cause, when the amplitude and phase are controlled by the vector regulators in the first error detection means, in the first error rejection means and in the second error rejection means, the vector regulators to be each controlled by common control means.

It offers an advantage of being able to implement a low cost, small size feedforward amplifier.

The feedforward amplifier in accordance with the present invention may combine the first pilot signal with the input signal combined by the combining means to cancel out the first pilot signal contained in the input signal, and detect the error component and the first pilot signal by using the input signal in which the first pilot signal is canceled out.

It offers an advantage of being able to miniaturize the feedforward amplifier.

The feedforward amplifier in accordance with the present invention may further comprise in addition to the first and second error detection means and first and second error rejection means, at least one error detection means and at least one error rejection means to increase a number of stages of the error detection means and error rejection means to at least three.

It offers an advantage of being able to implement more satisfactory error compensation, thereby achieving a good error characteristic.

BEST MODE FOR CARRYING OUT THE INVENTION

The best mode for carrying out the invention will now be described with reference to the accompanying drawings to explain the present invention in more detail.
Embodiment 1

Figure 1:
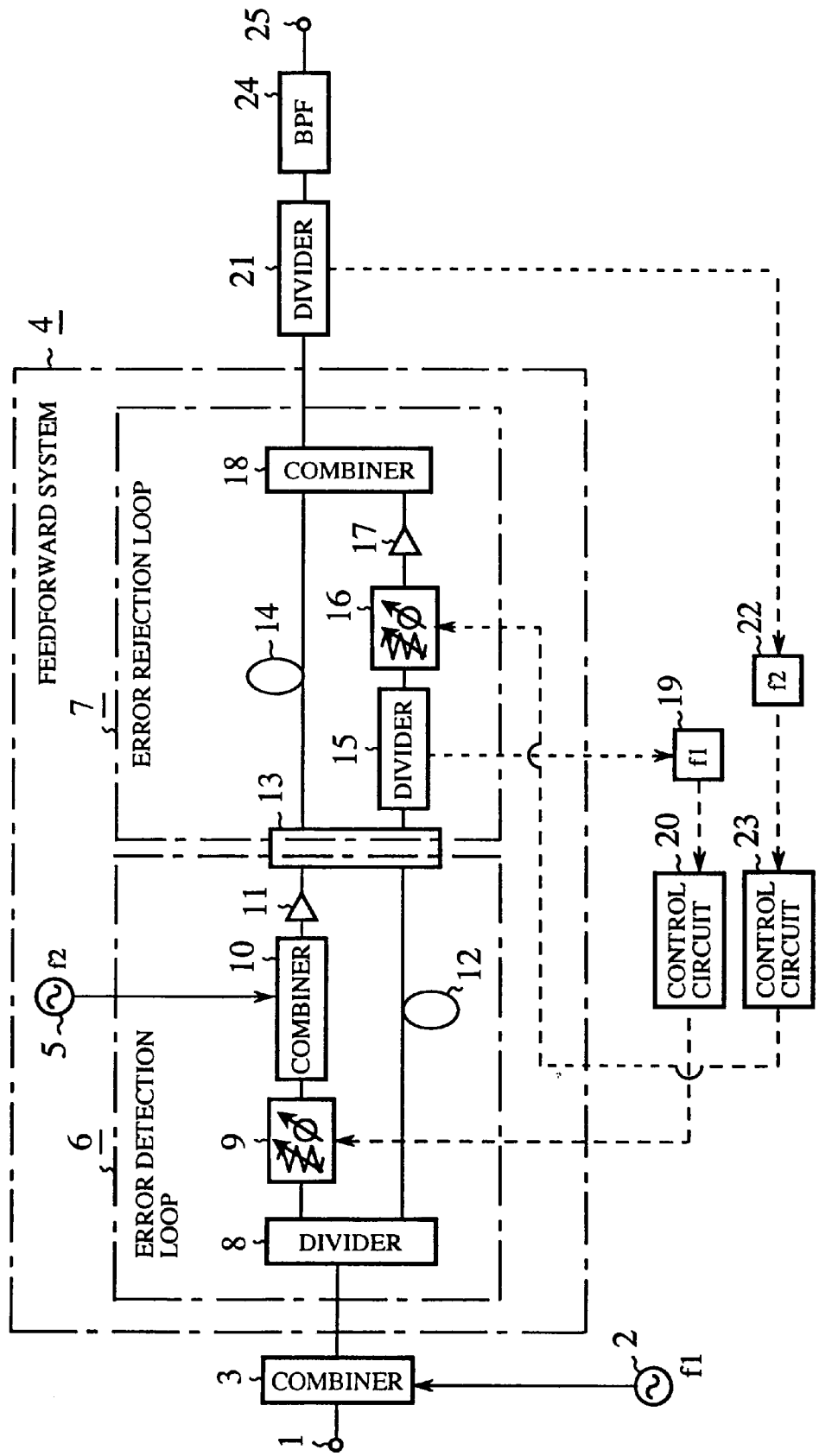
FIG. 1 is a block diagram showing a configuration of a conventional feedforward amplifier.
Figure 2:
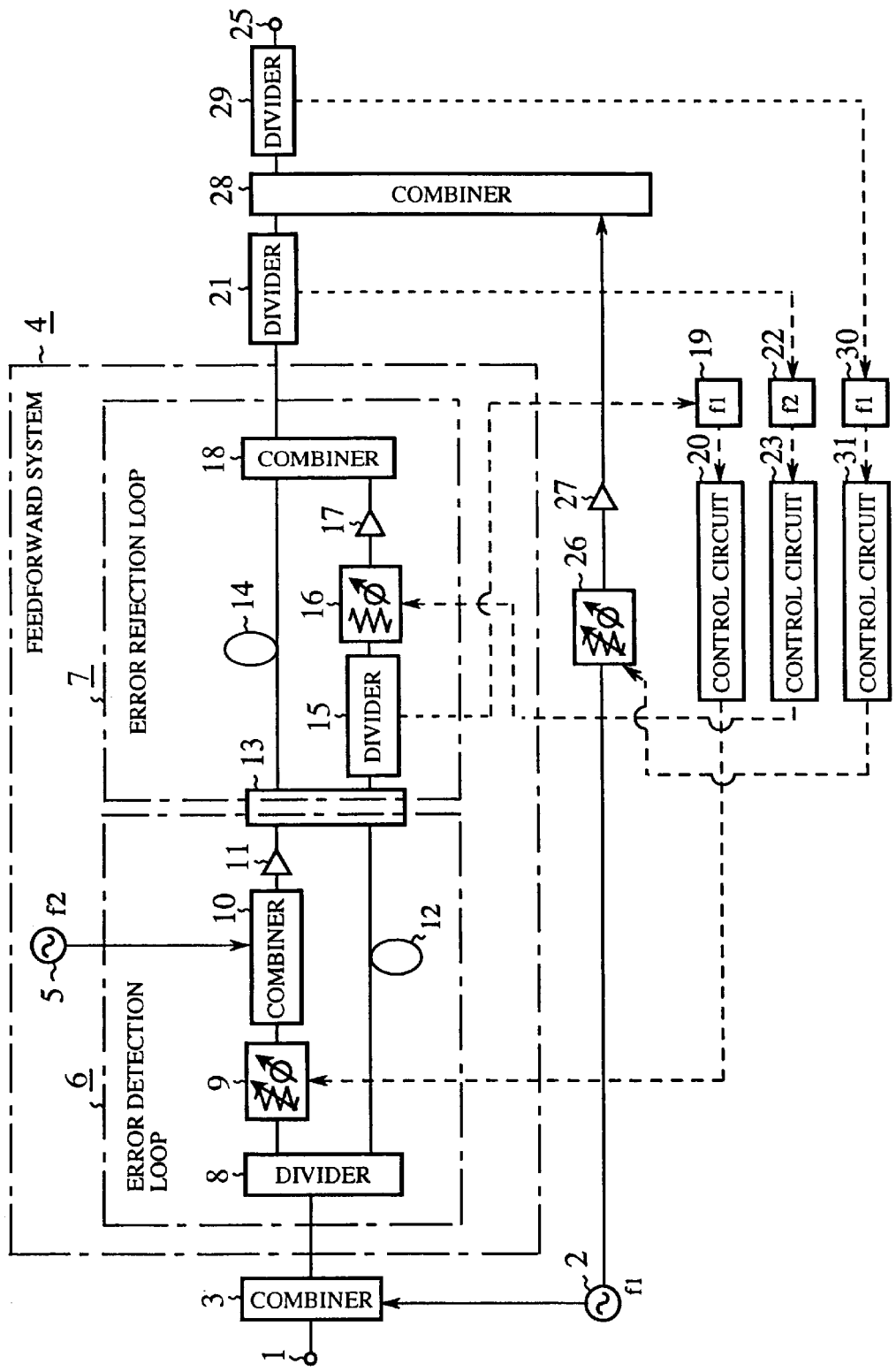
FIG. 2 is a block diagram showing another configuration of a conventional feedforward amplifier.
Figure 3:
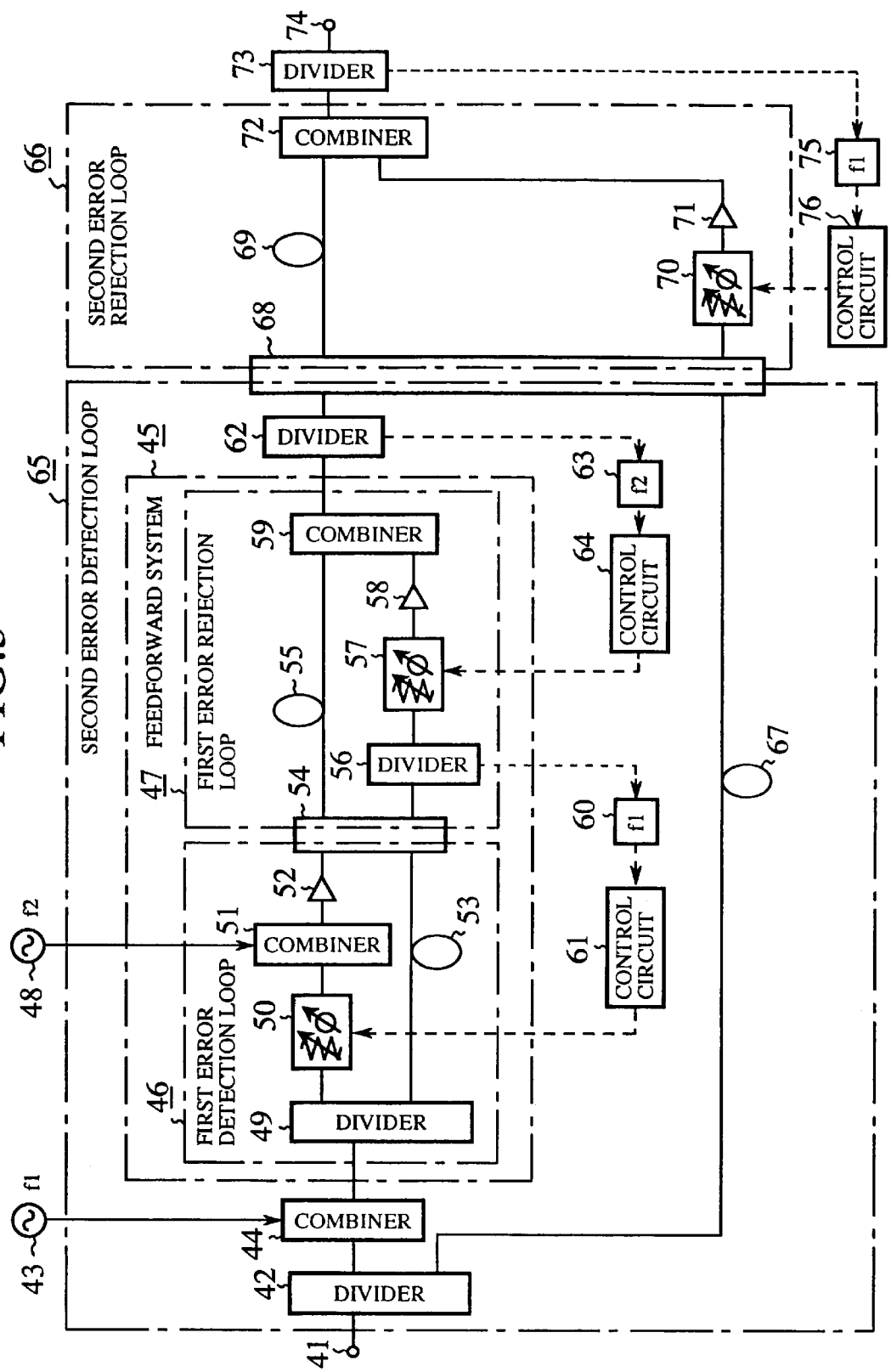
FIG. 3 is a block diagram showing a configuration of an embodiment 1 of the feedforward amplifier in accordance with the present invention.

FIG. 3 is a block diagram showing a configuration of an embodiment 1 of the feedforward amplifier in accordance with the present invention. In this figure, the reference numeral 41 designates an input terminal of a feedforward amplifier; 42 designates a divider for dividing the input signal into two paths; 43 designates a pilot signal oscillator for generating a first pilot signal (frequency f1); and 44 designates a combiner for combining the first pilot signal with the input signal supplied from the input terminal 41. The pilot signal oscillator 43 and the combiner 44 constitute a combining means.

The reference numeral 45 designates a feedforward system; 46 designates a first error detection loop (first error detection means) for amplifying the input signal output from the combiner 44, and for detecting the error component produced in the amplification of the input signal; 47 designates a first error rejection loop (first error rejection means) for canceling out the error component in the amplified input signal; and 48 designates a pilot signal oscillator for generating a second pilot signal (frequency f2).

The reference numeral 49 designates a divider for dividing the input signal which is combined with the first pilot signal by the combiner 44 into two paths; 50 designates a vector regulator for electrically regulating the passing amplitude and phase of the input signal divided by the divider 49; 51 designates a combiner for combining the second pilot signal with the input signal the vector regulator 50 outputs; 52 designates a main amplifier for amplifying the input signal output combined by the combiner 51; 53 designates a delay circuit for delaying the input signal divided by the divider 49; and 54 designates a dividing combiner for dividing the input signal amplified by the main amplifier 52 into two portions, for supplying one of them to a delay circuit 55, and for combining the other of them with the input signal delayed through the delay circuit 53, thereby canceling out the input signal component of the other input signal to extract the error component produced by the main amplifier 52.

The reference numeral 55 designates the delay circuit for delaying the input signal supplied from the dividing combiner 54; 56 designates a divider for dividing the error component extracted by the dividing combiner 54 into two paths; 57 designates a vector regulator for electrically regulating the passing amplitude and phase of the error component output from the divider 56; 58 designates an auxiliary amplifier for amplifying the error component the vector regulator 57 outputs; and 59 designates a combiner for combining the input signal delayed through the delay circuit 55 with the amplified error component to cancel out the error component in the input signal.

The reference numeral 60 designates a pilot signal detector for detecting the first pilot signal from the output signal of the divider 56; 61 designates a control circuit for controlling the vector regulator 50 such that the power level (signal level) of the first pilot signal detected by the pilot signal detector 60 becomes minimum; 62 designates a divider for dividing the input signal, from which the combiner 59 cancels out the error component, into two paths; 63 designates a pilot signal detector for detecting the second pilot signal from the input signal output from the divider 62; and 64 designates a control circuit for controlling the vector regulator 57 such that the power level (signal level) of the second pilot signal detected by the pilot signal detector 63 becomes minimum.

The reference numeral 65 designates a second error detection loop (second error detection means) for detecting the error component and the first pilot signal residual in the input signal combined by the first error rejection loop 47; and 66 designates a second error rejection loop (second error rejection means) for combining the input signal combined by the first error rejection loop 47 with the error component and the first pilot signal extracted by the second error detection loop 65 to cancel out the error component and the first pilot signal residual in the input signal.

The reference numeral 67 designates a delay circuit for delaying the input signal divided by the divider 42; 68 designates a dividing combiner for supplying the input signal divided by the divider 62 to a delay circuit 69, and for extracting the error component and the first pilot signal residual in the input signal by combining the input signal divided by the divider 62 with the delayed input signal; 69 designates the delay circuit for delaying the input signal supplied from the dividing combiner 68; 70 designates a vector regulator for electrically regulating the passing amplitude and phase of the error component and the first pilot signal extracted by the dividing combiner 68; 71 designates an auxiliary amplifier for amplifying the error component and the first pilot signal; and 72 designates a combiner for combining the input signal delayed by the delay circuit 69 with the amplified error component and first pilot signal, thereby canceling out the error component and the first pilot signal in the delayed input signal.

The reference numeral 73 designates a divider for dividing the input signal, from which the combiner 72 cancels out the error component and the first pilot signal, into two paths; 74 designates an output terminal of the feedforward amplifier; 75 designates a pilot signal detector for detecting the first pilot signal from the output signal of the divider 73; and 76 designates a control circuit for controlling the vector regulator 70 such that the power level (signal level) of the first pilot signal detected by the pilot signal detector 75 becomes minimum.

Next, the operation will be described.

First, the divider 42 divides the input signal supplied from the input terminal 41 into two paths, and the combiner 44 combines one of them with the first pilot signal. Then, the first error detection loop 46 amplifies the input signal, and detects the error component involved in the amplification of the input signal.

Specifically, when the divider 49 of the first error detection loop 46 divides the input signal output from the combiner 44 into two paths, the vector regulator 50 electrically regulates the passing amplitude and phase of a first portion of the input signal. Subsequently, the combiner 51 combines the input signal with the second pilot signal, and the main amplifier 52 amplifies the input signal combined by the combiner 51.

In parallel with this, the delay circuit 53 delays a second portion of the input signal divided by the divider 49 by a predetermined time period, and supplies the input signal to the dividing combiner 54.

Receiving the amplified input signal from the main amplifier 52, the dividing combiner 54 divides the input signal into two portions, and supplies a first portion of the input signal to the delay circuit 55. Besides, it combines the second portion of the input signal with the input signal output from the delay circuit 53, thereby detecting the error component produced by the main amplifier 52 by canceling out the input signal component in the amplified input signal.

Here, the first error detection loop 46 is optimized as follows.

Specifically, when the pilot signal detector 60 detects the first pilot signal from the output signal of the divider 56, the control circuit 61 controls the vector regulator 50 such that the power level of the first pilot signal becomes minimum, thereby optimizing the first error detection loop 46.

When the first error detection loop 46 extracts the error component in the input signal, the first error rejection loop 47 cancels out the error component in the input signal.

Specifically, the vector regulator 57 of the first error rejection loop 47 electrically regulates the passing amplitude and phase of the error component output from the divider 56, and the auxiliary amplifier 58 amplifies the error component. Then the combiner 59 combines the amplified error component with the input signal delayed through the delay circuit 55, thereby canceling out the error component in the input signal (canceling out the error component in the input signal by combining it with the error component with the identical amplitude and opposite phase to those of the error component in the amplified input signal).

Here, the first error rejection loop 47 is optimized as follows.

Specifically, when the pilot signal detector 63 detects the second pilot signal in the output signal of the divider 62, the control circuit 64 controls the vector regulator 57 such that the power level of the second pilot signal becomes minimum, thereby optimizing the first error rejection loop 47.

The second error detection loop 65 extracts the error component residual in the input signal supplied from the first error rejection loop 47 (although the error component is eliminated by the first error rejection loop 47, a little error component remains in practice), and the first pilot signal (the first pilot signal is not canceled out principally by the feedforward system 45).

Specifically, receiving the input signal from the divider 62, the dividing combiner 68 supplies the input signal to the delay circuit 69. In parallel with this, the dividing combiner 68 combines the input signal with the input signal delayed by the delay circuit 67 (that is, combines the input signal with the delayed input signal with the identical amplitude and opposite phase to the input signal divided by the divider 62), thereby canceling out the input signal component of the input signal. Thus, the dividing combiner 68 extracts the error component and the first pilot signal residual in the input signal.

The second error rejection loop 66 combines the input signal combined by the first error rejection loop 47 with the error component and the first pilot signal extracted by the second error detection loop 65, thereby canceling out the error component and the first pilot signal residual in the input signal.

Specifically, the combiner 72 combines the input signal delayed by the delay circuit 69 with the error component and first pilot signal amplified by the auxiliary amplifier 71 (that is, combines the delayed input signal with the error component and first pilot signal having the identical amplitude and opposite phase to the error component and first pilot signal residual in the delayed input signal), thereby canceling out the error component and the first pilot signal residual in the delayed input signal. Thus, the combiner 72 supplies the input signal to the output terminal 74 through the divider 73.

In this case, to increase the rejection accuracy of the first pilot signal, when the pilot signal detector 75 detects the first pilot signal in the output signal of the divider 73, the control circuit 76 controls the vector regulator 70 such that the power level of the first pilot signal becomes minimum.

As described above, the present embodiment 1 is configured such that it combines the input signal combined by the first error rejection loop 47 with the error component and the first pilot signal extracted by the second error detection loop 65, thereby canceling out the error component and the first pilot signal residual in the input signal. Thus, the present embodiment offers an advantage of being able to compensate for the error characteristic at high efficiency with compact size.

Specifically, it can implement a feedforward amplifier at a very low error rate by canceling out the first pilot signal which is output from the output terminal of the feedforward amplifier of the conventional example 1, and by performing the error compensation once again by the feedforward system.

The first pilot signal is utilized for optimizing the first error detection loop 46 and the second error rejection loop 66, and the second pilot signal is utilized for optimizing the first error rejection loop 47. Thus, even if the characteristics of the components of the feedforward system such as amplifiers vary because of the changes in the ambient temperature and fluctuations in the supply voltage of the feedforward amplifier, the error compensation characteristic of the feedforward system is maintained in a favorable state in its entirety. Thus, a low error rate, highly efficient, small size amplifier can be implemented.

Furthermore, since the first error detection loop 46 is always maintained at the optimum state thanks to the first pilot signal, the feedforward amplifier can be always maintained at the optimum state even without the input signal, which differs from the conventional example that controls the error detection loop without using pilot signal. Therefore, the amplifier characteristic is maintained at the favorable condition even when the input signal increases sharply (as in the burst operation).

Incidentally, the positional relationship can be varied of the vector regulator 50, combiner 51 and main amplifier 52 that constitute the first error detection loop 46.

For example, the combiner 51 may be placed at the output side of the main amplifier 52, or at an intermediate position between the stages when the main amplifier 52 consists of a multi-stage amplifier. Besides, the vector regulator 50 may be inserted into the path of the delay circuit 53.

Likewise, the order of the divider 56, vector regulator 57 and auxiliary amplifier 58 may be changed. For example, the divider 56 may be placed at the output side of the auxiliary amplifier 58. Several variations can be implemented with maintaining the positional relationships between the error detection loop and error rejection loop and the position at which the pilot signal is applied. The present invention is also effective when a modulated signal is used as the pilot signals.

Embodiment 2

Figure 4:
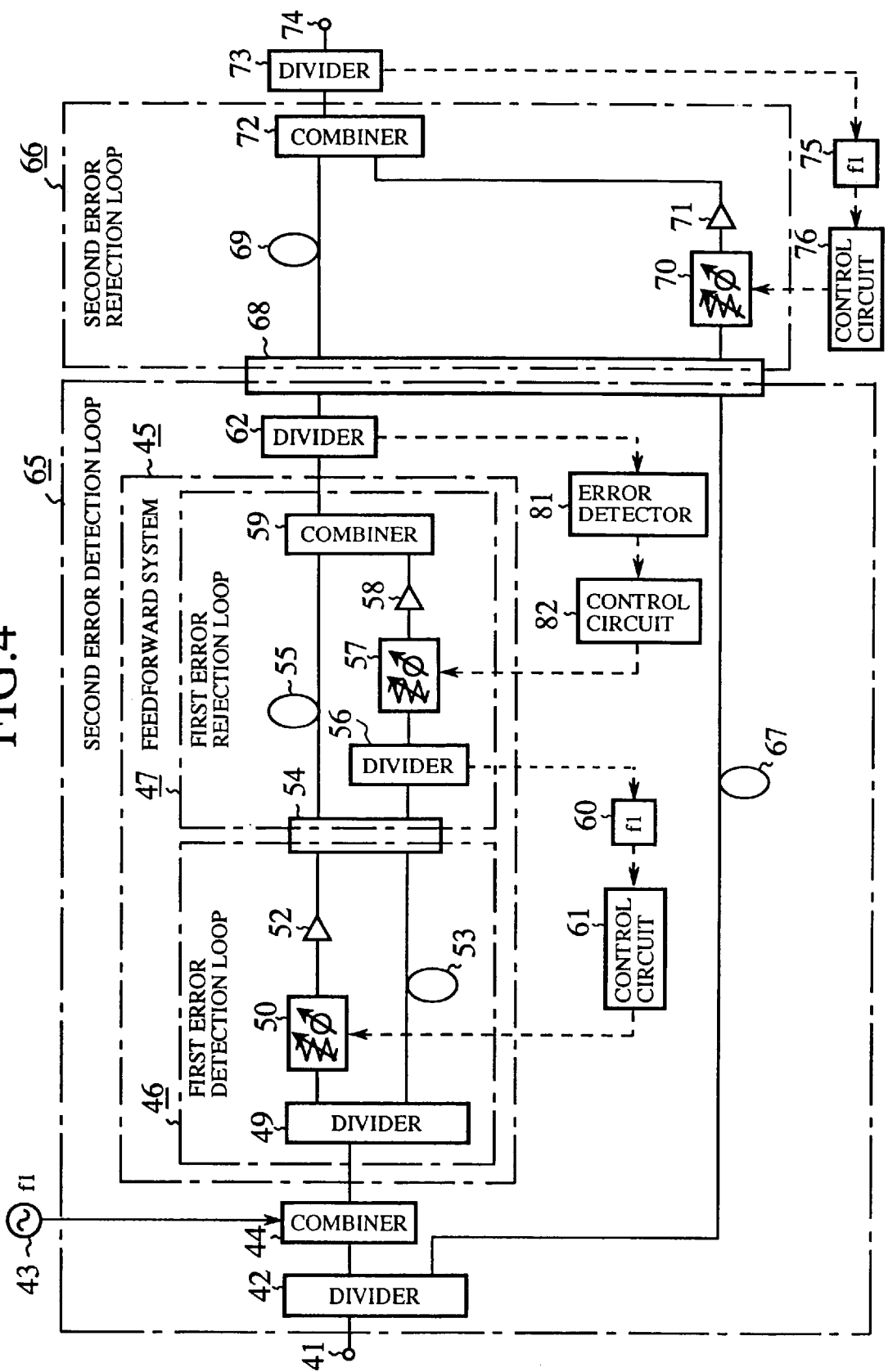
FIG. 4 is a block diagram showing a configuration of an embodiment 2 of the feedforward amplifier in accordance with the present invention.

FIG. 4 is a block diagram showing a configuration of an embodiment 2 of the feedforward amplifier in accordance with the present invention. In this figure, since the same reference numerals designate the same or like portions to those of FIG. 3, the description thereof is omitted here.

The reference numeral 81 designates an error detector for detecting an error component from the input signal divided by the divider 62; and 82 designates a control circuit for controlling the vector regulator 57 such that the power level (signal level) of the error component detected by the error detector 81 becomes minimum.

Next, the operation will be described.

Although the foregoing embodiment 1 is configured such that it injects the second pilot signal into the feedforward system 45, and optimizes the first error rejection loop 47 by detecting the second pilot signal, this is not essential. For example, the configuration is possible in which the error detector 81 detects the error component in the input signal, and the control circuit 82 controls the vector regulator 57 such that the power level of the error component becomes minimum.

Incidentally, the error detector 81 can be supplied not only with the output signal of the feedforward amplifier, but also with a part of the input signal by dividing it at the input terminal 41.

In addition to the advantages of the foregoing embodiment 1, the present embodiment 2 is less affected by the frequency characteristic and can reduce the error at higher accuracy than the configuration using the second pilot signal because it carries out such control that reduces the power of the error component.

Embodiment 3

Figure 5:
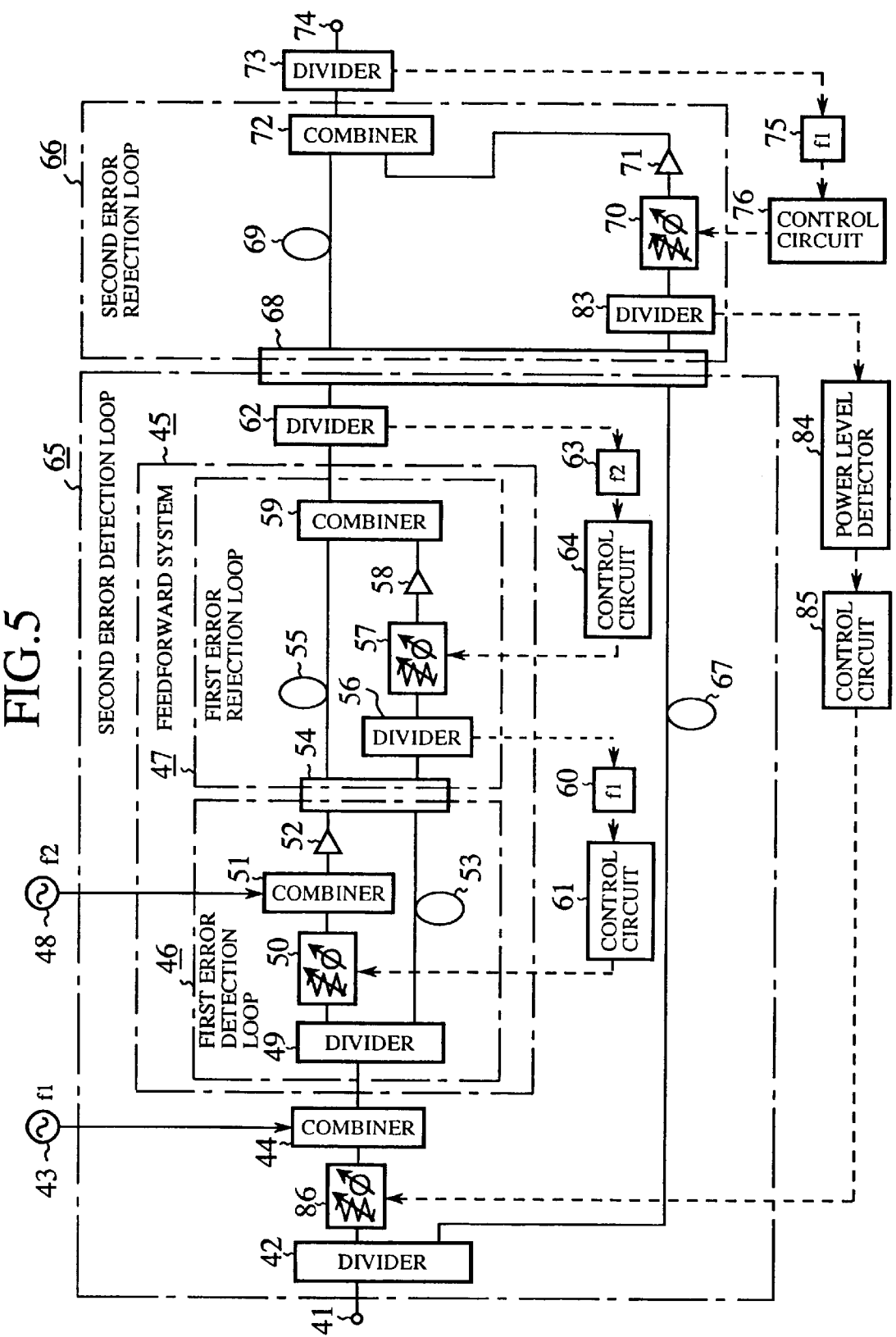
FIG. 5 is a block diagram showing a configuration of an embodiment 3 of the feedforward amplifier in accordance with the present invention.

FIG. 5 is a block diagram showing a configuration of an embodiment 3 of the feedforward amplifier in accordance with the present invention. In this figure, since the same reference numerals designate the same or like portions to those of FIG. 3, the description thereof is omitted here.

In FIG. 5, the reference numeral 83 designates a divider for dividing the error component and the first and second pilot signals extracted by the dividing combiner 68; 84 designates a power level detector for detecting the power level (signal level) of the output signal of the divider 83; 85 designates a control circuit for controlling a vector regulator 86 such that the power level detected by the power level detector 84 becomes minimum; and 86 designates the vector regulator for electrically regulating the passing amplitude and phase of the input signal divided by the divider 42.

Next, the operation will be described.

Although the foregoing embodiment 1 does not make any mention of the optimization control of the second error detection loop 65, it is possible. For example, the configuration can be implemented in which the power level detector 84 detects the power level of the output signal of the dividing combiner 68, and the control circuit 85 controls the vector regulator 86 such that the power level detected by the power level detector 84 becomes minimum.

Specifically, although the path of the auxiliary amplifier 71 in the second error rejection loop 66 includes an error of the entire feedforward system 45, which is extracted by the second error detection loop 65, when the second error detection loop 65 is not in the optimum state, the input signal component is not completely canceled out, thereby leaving a small amount thereof. The optimum state of the second error detection loop 65 is implemented by minimizing the power of the residual input signal component. Accordingly, the power level detector 84 detects the power level of the output signal of the divider 83, and the control circuit 85 controls the vector regulator 86 in response to the power level.

Thus, the second error detection loop 65 is optimized, and hence the power of the residual input signal component which is not fully canceled out becomes minimum. As a result, the power consumption of the auxiliary amplifier 71 can be reduced. Therefore, the present embodiment offers an advantage of being able to increase the efficiency and reduce the size of the feedforward amplifier in its entirety.

Embodiment 4

Figure 6:
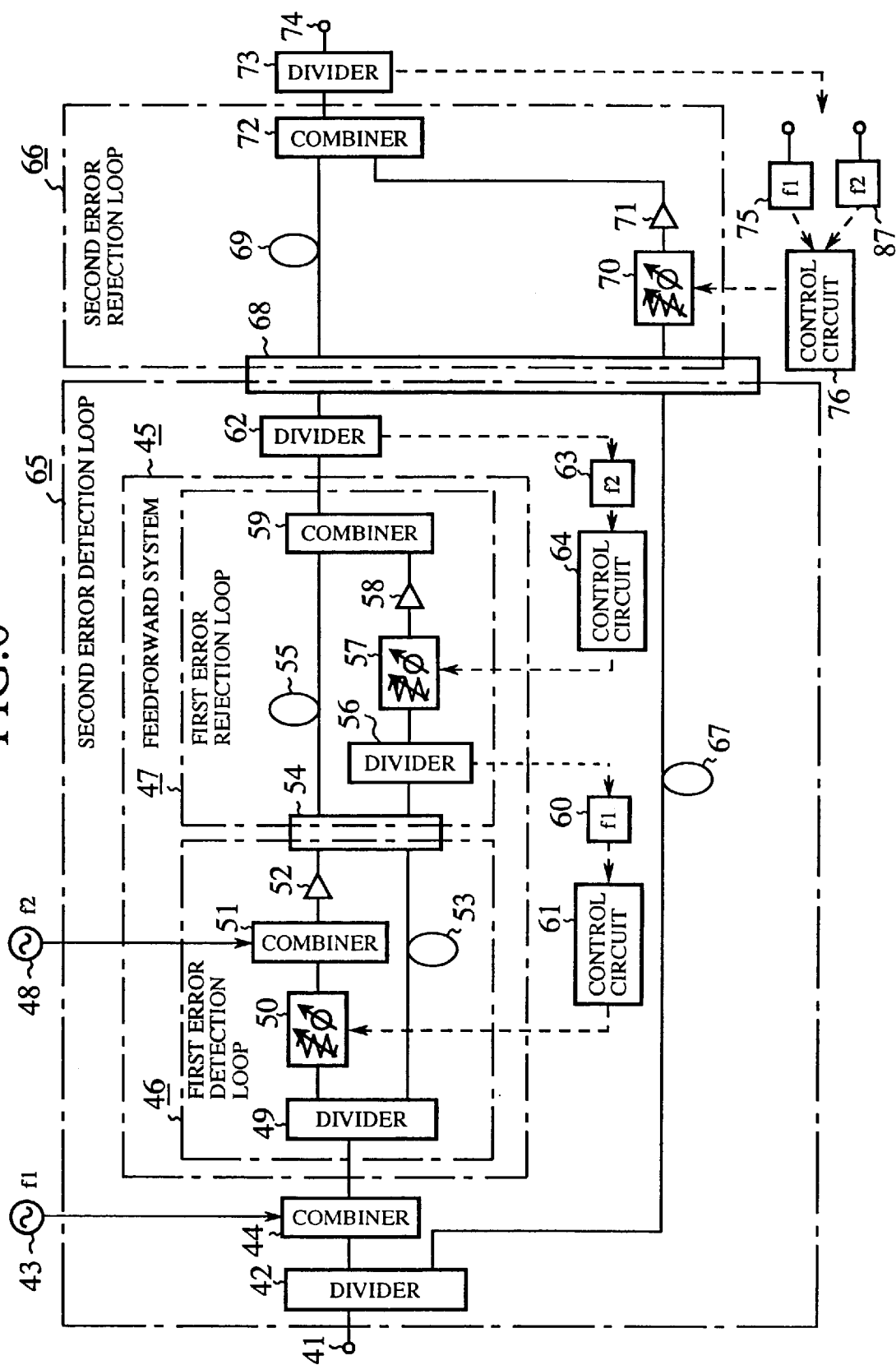
FIG. 6 is a block diagram showing a configuration of an embodiment 4 of the feedforward amplifier in accordance with the present invention.

FIG. 6 is a block diagram showing a configuration of an embodiment 4 of the feedforward amplifier in accordance with the present invention. In this figure, since the same reference numerals designate the same or like portions to those of FIG. 3, the description thereof is omitted here.

In FIG. 6, the reference numeral 87 designates a pilot signal detector for detecting the second pilot signal from the output signal of the divider 73.

Next, the operation will be described.

Although the foregoing embodiment 1 detects the first pilot signal to perform the optimization control of the second error rejection loop 66, it is also possible to detect the second pilot signal to perform the optimization control of the second error rejection loop 66.

Ideally, the second pilot signal is not output from the feedforward system 45, because it is canceled out by the first error rejection loop 47. In the actual feedforward amplifier, however, the first error rejection loop 47 is not always ideal, and hence the second pilot signal can be output a little.

In view of this, the present embodiment 4 is configured such that the pilot signal detector 87, which is installed in addition to the pilot signal detector 75 for detecting the first pilot signal, is provided to detect the second pilot signal so that one of the signals detected by the pilot signal detectors is selectively supplied to the control circuit 76.

Thus, the present embodiment can minimize the signal level not only of the first pilot signal, but also of the second pilot signal. As a result, it offers an advantage of being able to implement favorable error compensation over a wide range.

Embodiment 5

Figure 7:
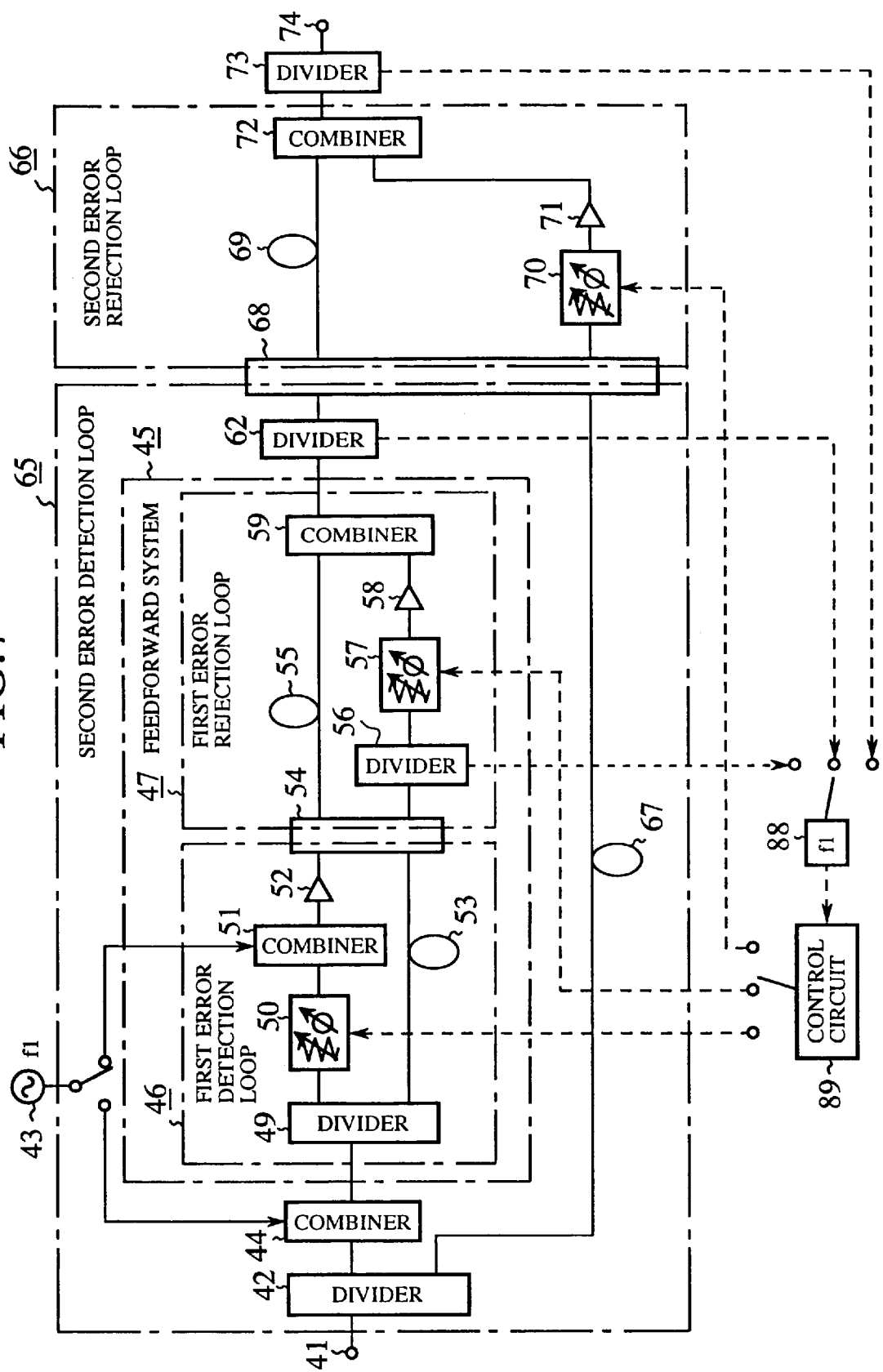
FIG. 7 is a block diagram showing a configuration of an embodiment 5 of the feedforward amplifier in accordance with the present invention.

FIG. 7 is a block diagram showing a configuration of an embodiment 5 of the feedforward amplifier in accordance with the present invention. In this figure, since the same reference numerals designate the same or like portions to those of FIG. 3, the description thereof is omitted here.

In FIG. 7, the reference numeral 88 designates a pilot signal detector for detecting the first pilot signal in the output signal of the divider 56, 62 or 73; and 89 designates a control circuit for controlling the vector regulator 50, 57 or 70 such that the power level (signal level) of the first pilot signal detected by the pilot signal detector 88 becomes minimum.

Next, the operation will be described.

The present embodiment differs from the foregoing embodiment 1 in that it obviates the pilot signal oscillator 48 for generating the second pilot signal, switches the output of the pilot signal oscillator 43 for generating the first pilot signal, and supplies it to the combiner 44 or 51

In addition, the present embodiment is configured such that the signal divided by the divider 56, 62 or 73 is detected by the single pilot signal detector 88 by switching them, and that the control circuit 89 controls the vector regulator 50, 57 or 70 such that the signal level of the corresponding pilot signal becomes minimum.

When the pilot signal oscillator 43 is connected to the combiner 51, the pilot signal detector 88 detects the output signal of the divider 62, and the control circuit 89 controls the vector regulator 57 such that the signal level of the output signal becomes minimum.

When the pilot signal oscillator 43 is connected to the combiner 44, the pilot signal detector 88 detects the output signal of the divider 56, and the control circuit 89 controls the vector regulator 50 such that the signal level of the output signal becomes minimum. Alternatively, it detects the output signal of the divider 73, and the control circuit 89 controls the vector regulator 70 such that the signal level of the output signal becomes minimum.

Incidentally, such a configuration is also possible in which only one of the pilot signal oscillator 43 the pilot signal detector 88 is made single, and the other of them is left multiple as in the foregoing embodiment 1.

With the foregoing configuration, the present embodiment can reduce the number of the pilot signal oscillators and pilot signal detectors, thereby offering an advantage of being able to reduce the cost and size of the feedforward amplifier.

Embodiment 6

Figure 8:
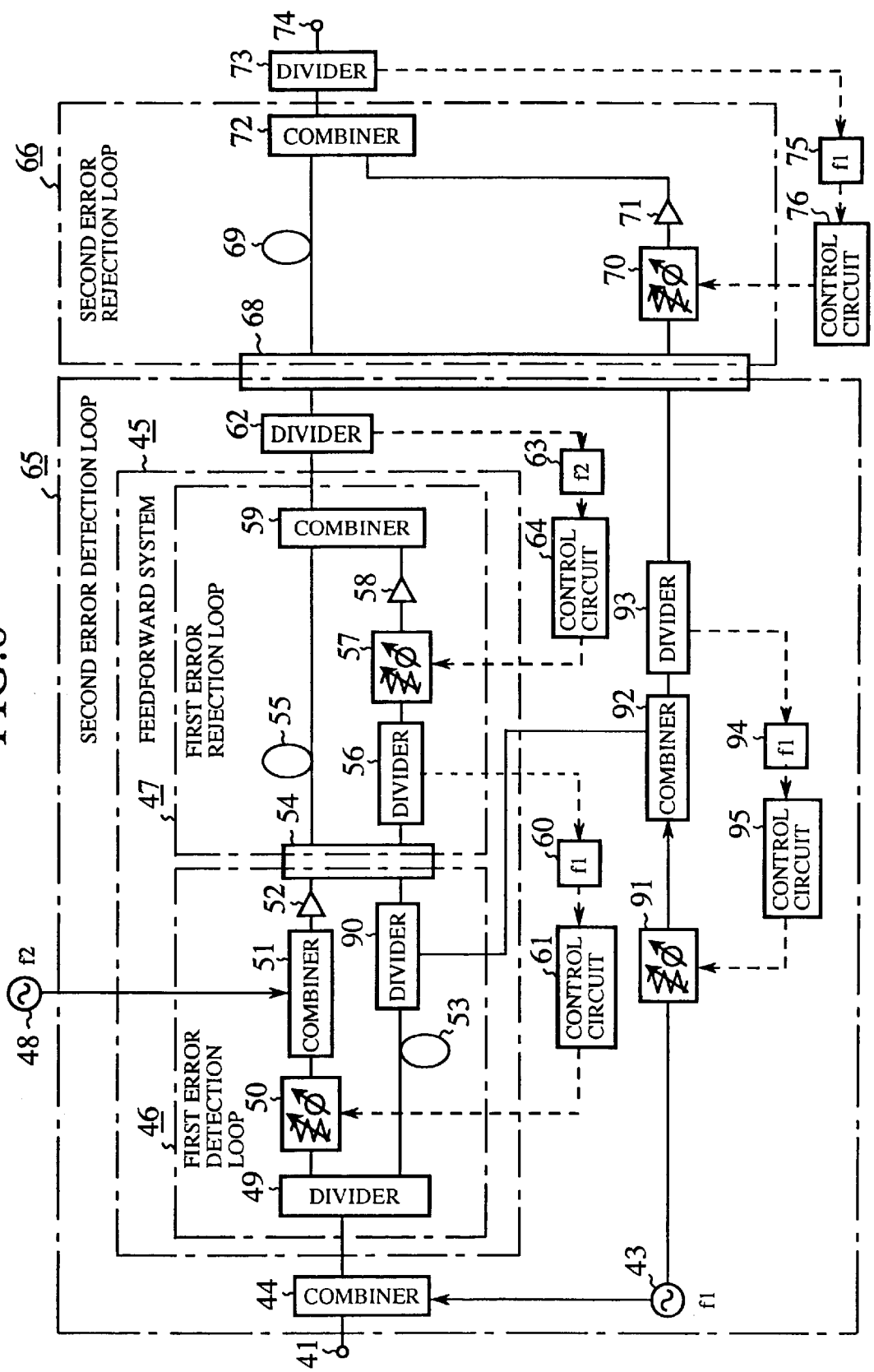
FIG. 8 is a block diagram showing a configuration of an embodiment 6 of the feedforward amplifier in accordance with the present invention.

FIG. 8 is a block diagram showing a configuration of an embodiment 6 of the feedforward amplifier in accordance with the present invention. In this figure, since the same reference numerals designate the same or like portions to those of FIG. 3, the description thereof is omitted here.

In FIG. 8, the reference numeral 90 designates a divider for dividing the input signal delayed by the delay circuit 53;

91 designates a vector regulator for electrically regulating the passing amplitude and phase of the first pilot signal; 92 designates a combiner for combining the first pilot signal with the input signal divided by the divider 90, thereby canceling out the first pilot signal in the input signal; 93 designates a divider for dividing the input signal combined by the combiner 92; 94 designates a pilot signal detector for detecting the first pilot signal in the input signal divided by the divider 93; and 95 designates a control circuit for controlling the vector regulator 91 such that the power level (signal level) of the first pilot signal detected by the pilot signal detector 94 becomes minimum.

Next, the operation will be described.

Although the foregoing embodiment 1 comprises the delay circuit 67 for supplying the delayed input signal to the dividing combiner 68, the delay circuit 67 can be eliminated by configuring as shown in FIG. 8.

Specifically, the divider 90 divides the delayed input signal output from the delay circuit 53, and the combiner 92 combines the input signal divided by the divider 90 with the first pilot signal, thereby canceling out the first pilot signal in the input signal (canceling out the first pilot signal in the input signal by combining the input signal with the first pilot signal having the identical amplitude and opposite phase to those of the first pilot signal in the input signal).

In this case, to increase the rejection accuracy of the first pilot signal, while the pilot signal detector 94 detects the first pilot signal in the output signal of the divider 93, the control circuit 95 controls the vector regulator 91 such that the power level of the first pilot signal becomes minimum.

In this way, the signal appearing at the output of the divider 93 includes a slightest part of the first pilot signal, leaving only the input signal component input to the feedforward amplifier. This signal is supplied to the dividing combiner 68 to be combined with the output signal of the feedforward system 45 in the same amplitude and opposite phases, to be used for detecting the error by canceling out the input signal component of the feedforward system 45.

With such a configuration, the present embodiment can obviate the delay circuit 67 which is necessary in the foregoing embodiment 1. Thus, in addition to the advantages of the foregoing embodiment 1, the present embodiment offers an advantage of being able to reduce the size of the feedforward amplifier.

Embodiment 7

Figure 9:
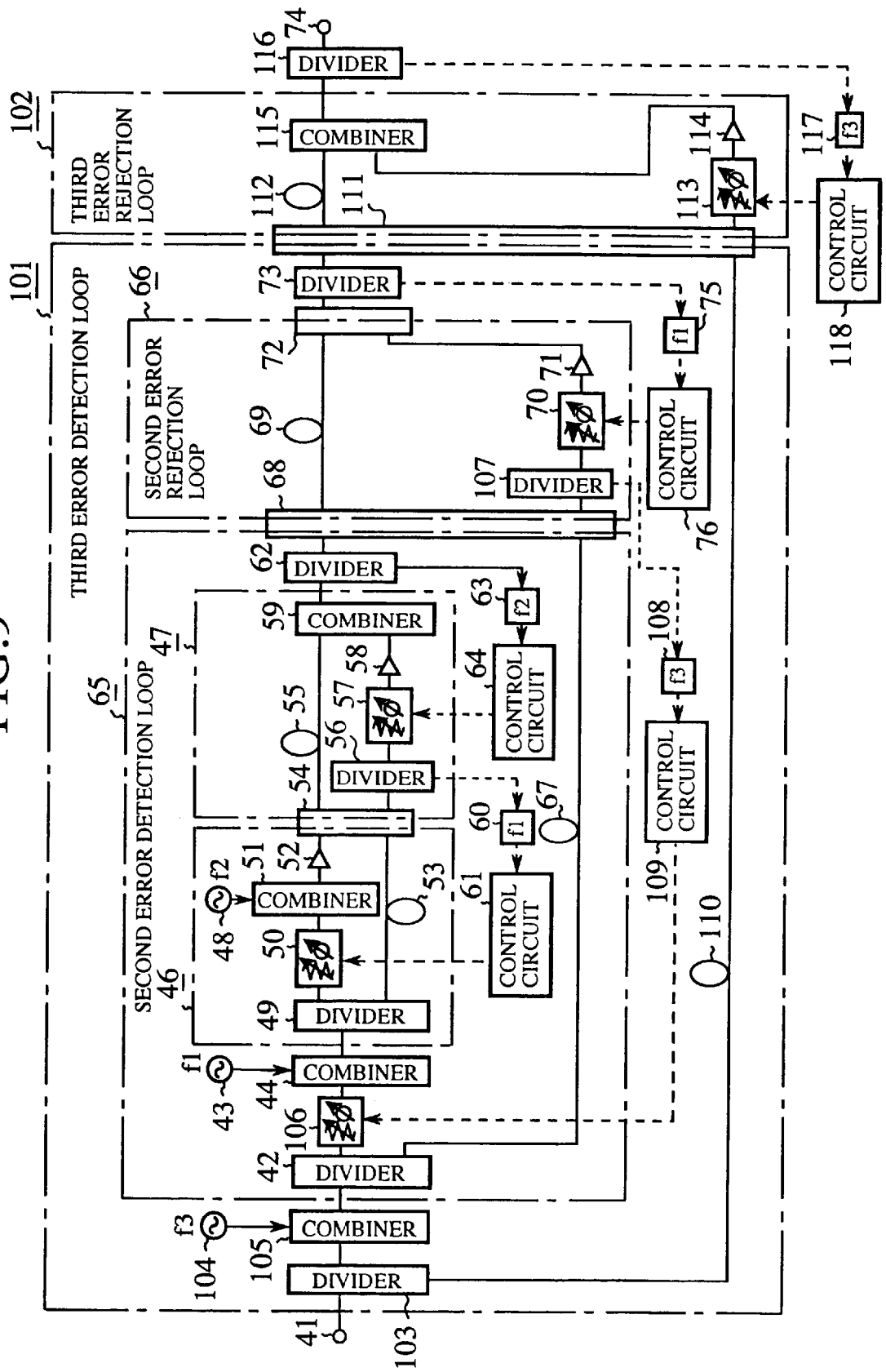
FIG. 9 is a block diagram showing a configuration of an embodiment 7 of the feedforward amplifier in accordance with the present invention.

FIG. 9 is a block diagram showing a configuration of an embodiment 7 of the feedforward amplifier in accordance with the present invention. In this figure, since the same reference numerals designate the same or like portions to those of FIG. 3, the description thereof is omitted here.

In FIG. 9, the reference numeral 101 designates a third error detection loop; 102 designates a third error rejection loop; 103 designates a divider for dividing the input signal; 104 designates a pilot signal oscillator for generating a third pilot signal (frequency f3); 105 designates a combiner for combining the third pilot signal with the input signal; 106 designates a vector regulator for electrically regulating the passing amplitude and phase of the input signal; 107 designates a divider; 108 designates a pilot signal detector for detecting the third pilot signal; and 109 designates a control circuit for controlling the vector regulator 106 such that the power level (signal level) of the third pilot signal detected by the pilot signal detector 108 becomes minimum.

The reference numeral 110 designates a delay circuit for delaying the input signal; 111 designates a dividing combiner for supplying the input signal divided by the divider 73 to a delay circuit 112, and for combining the input signal divided by the divider 73 with the input signal delayed by the delay circuit 110, thereby extracting the error component and third pilot signal residual in the input signal; 112 designates the delay circuit for delaying the input signal supplied from the dividing combiner 111; 113 designates a vector regulator for electrically regulating the passing amplitude and phase of the error component and third pilot signal extracted by the dividing combiner 111; 114 designates an auxiliary amplifier for amplifying the error component and the third pilot signal; and 115 designates a combiner for combining the input signal delayed by the delay circuit 112 with the amplified error component and third pilot signal, thereby canceling out the error component and third pilot signal in the delayed input signal.

The reference numeral 116 designates a divider for dividing the input signal, in which the combiner 115 cancels out the error component and the third pilot signal, into two paths; 117 designates a pilot signal detector for detecting the third pilot signal in the output signal of the divider 116; and 118 designates a control circuit for controlling the vector regulator 113 such that the power level (signal level) of the third pilot signal detected by the pilot signal detector 117 becomes minimum.

Next, the operation will be described.

Although the error detection loops and the error rejection loops have the two stage configuration in the foregoing embodiment 1, they can have a three stage configuration as shown in FIG. 9 by adding the third error detection loop 101 and third error rejection loop 102 to the first and second error detection loops and the first and second error rejection loops.

With such a configuration, the present embodiment can further reduce the effect of the temperature changes and supply voltage fluctuations because of the increasing number of times of the error compensation by the feedforward. Thus, it can implement better error compensation, thereby offering an advantage of being able to achieve the better error characteristic.

Incidentally, although the present embodiment 7 shows the three stage configuration of the error detection loops and the error rejection loops, this is not essential. For example, it is obvious that the four or more stage configuration can be implemented.

Furthermore, the foregoing embodiments 2–6 can be combined to create new configurations.

INDUSTRIAL APPLICABILITY

As described above, the feedforward amplifier in accordance with the present invention has a small size and high efficiency, and is suitable for compensating for the error characteristic.

What is claimed is:

1. A feedforward amplifier, comprising:
combining means for combining an input signal with a first pilot signal;
first error detection means for amplifying the input signal that is combined with the first pilot signal by said combining means, and for detecting an error component in the input signal amplified;
first error rejection means for canceling out the error component in the input signal amplified by said first error detection means by combining the input signal with the error component;
second error detection means for detecting the error component and the first pilot signal residual in the input signal combined by said first error rejection means; and
second error rejection means for combining the input signal combined by said first error rejection means with the error component and the first pilot signal detected by said second error detection means to cancel out the error component and the first pilot signal residual in the input signal, wherein said first error detection means adjusts amplitude and phase of the input signal combined with the first pilot signal by said combining means to minimize a signal level of the first pilot signal.

2. The feedforward amplifier according to claim 1, wherein said second error rejection means adjusts amplitude and phase of the error component and the first pilot signal detected by said second error detection means to minimize a signal level of the first pilot signal.

3. The feedforward amplifier according to claim 1, wherein when said first error detection means combines a second pilot signal with the input signal, said first error rejection means adjusts amplitude and phase of the error component and the second pilot signal detected by said first error detection means to minimize a signal level of the second pilot signal.

4. The feedforward amplifier according to claim 3, wherein when said first error detection means combines a second pilot signal with the input signal, said second error rejection means adjusts amplitude and phase of the error component and the first and second pilot signals detected by said second error detection means to minimize a signal level of the first and second pilot signals.

5. The feedforward amplifier according to claim 1, wherein said first error rejection means adjusts amplitude and phase of the error component detected by said first error detection means to minimize a signal level of the error component.

6. The feedforward amplifier according to claim 1, wherein said second error detection means adjusts amplitude and phase of the input signal supplied to said combining means to minimize a signal level of an input signal component contained in the input signal combined by said first error rejection means.

7. The feedforward amplifier according to claim 1, wherein when the amplitude and phase are controlled by vector regulators in said first error detection means, said first error rejections means and said second error rejection means, the vector regulators are each controlled by common control means.

8. The feedforward amplifier according to claim 1, wherein said second error detection means combines the first pilot signal with the input signal combined by said combining means to cancel out the first pilot signal contained in the input signal, and detects the error component and the first pilot signal using the input signal in which the first pilot signal is canceled out.

9. The feedforward amplifier according to claim 1, further comprising in addition to said first and second error detection means and first and second error rejection means, at least one error detection means and at least one error rejection means to increase a number of stages of said error detection means and error rejection means to at least three.

10. A feedforward amplifier, comprising:
combining means for combining an input signal with a first pilot signal;
first error detection means for amplifying the input signal that is combined with the first pilot signal by said combining means, and for detecting an error component in the input signal amplified;
first error rejection means for canceling out the error component in the input signal amplified by said first error detection means by combining the input signal with the error component;

second error detection means for detecting the error component and the first pilot signal residual in the input signal combined by said first error rejection means; and second error rejection means for combining the input signal combined by said first error rejection means with the error component and the first pilot signal detected by said second error detection means to cancel out the error component and the first pilot signal residual in the input signal, wherein when said first error detection means combines a second pilot signal with the input signal, said first error rejection means adjusts amplitude and phase of the error component and the second pilot signal detected by said first error detection means to minimize a signal level of the second pilot signal.

11. The feedforward amplifier according to claim 10, wherein said second error rejection means adjusts amplitude and phase of the error component and the first pilot signal detected by said second error detection means to minimize a signal level of the first pilot signal.

12. The feedforward amplifier according to claim 10, wherein said first error detection means adjusts amplitude and phase of the input signal combined with the first pilot signal by said combining means to minimize a signal level of the first pilot signal.

13. The feedforward amplifier according to claim 10, wherein said first error rejection means adjusts amplitude and phase of the error component detected by said first error detection means to minimize a signal level of the error component.

14. The feedforward amplifier according to claim 10, wherein said second error detection means adjusts amplitude and phase of the input signal supplied to said combining means to minimize a signal level of an input signal component contained in the input signal combined by said first error rejection means.

15. The feedforward amplifier according to claim 10, wherein when said first error detection means combines a second pilot signal with the input signal, said second error rejection means adjusts amplitude and phase of the error component and the first and second pilot signals detected by said second error detection means to minimize a signal level of the first and second pilot signals.

16. The feedforward amplifier according to claim 10, wherein when the amplitude and phase are controlled by vector regulators in said first error detection means, said first error rejection means and said second error rejection means, the vector regulators are each controlled by common control means.

17. The feedforward amplifier according to claim 10, wherein said second error detection means combines the first pilot signal with the input signal combined by said combining means to cancel out the first pilot signal contained in the input signal, and detects the error component and the first pilot signal using the input signal in which the first pilot signal is canceled out.

18. The feedforward amplifier according to claim 10, further comprising in addition to said first and second error detection means and first and second error rejection means, at least one error detection means and at least one error rejection means to increase a number of stages of said error detection means and error rejection means to at least three.

19. A feedforward amplifier, comprising:
combining means for combining an input signal with a first pilot signal;
first error detection means for dividing the combined input signal and first pilot signal, thereby producing a first error signal and a second error signal, for amplifying the first error signal, and for delaying the second error signal, the first error detection means being configured to detect an error component in the amplified first error signal by combining the amplified first error signal with the delayed second error signal;

first error rejection means for canceling out the error component in the amplified first error signal by combining the amplified first error signal with the error component;

second error detection means for detecting an error component and the first pilot signal residual in the amplified first error signal combined by the first error rejection means; and second error rejection means for combining the amplified first error signal combined by the first error rejection means with the error component and the first pilot signal detected by the second error detection means to cancel out the error component and the first pilot signal residual in the amplified first error signal.

* * * * *